(12) United States Patent
Zhong et al.

(10) Patent No.: US 10,701,168 B2
(45) Date of Patent: Jun. 30, 2020

(54) METHOD AND APPARATUS FOR COMPACTION OF DATA RECEIVED OVER A NETWORK

(71) Applicant: Intel Corporation, Santa Clara, CA (US)

(72) Inventors: Tao Zhong, Beijing (CN); Kshitij A. Doshi, Tempe, AZ (US); Gang Deng, Beijing (CN); Ting Lou, Beijin (CN); Zhongyan Lu, Beijin (CN)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 16/026,817

(22) Filed: Jul. 3, 2018

(65) Prior Publication Data

US 2019/0173970 A1 Jun. 6, 2019

Related U.S. Application Data

(63) Continuation of application No. 14/911,223, filed as application No. PCT/CN2015/074093 on Mar. 12, 2015, now Pat. No. 10,015,272.

(51) Int. Cl.
*H04L 29/08* (2006.01)
*H04L 29/06* (2006.01)
(Continued)

(52) U.S. Cl.
CPC .......... *H04L 67/2823* (2013.01); *G06F 3/067* (2013.01); *G06F 3/0608* (2013.01);
(Continued)

(58) Field of Classification Search
CPC ................................................. H04L 67/2823
See application file for complete search history.

(56) References Cited

U.S. PATENT DOCUMENTS

| 7,796,570 B1 * | 9/2010 | Farley ............... H04L 12/40013 370/338 |
| 2009/0106521 A1 | 4/2009 | Whisnant et al. |

(Continued)

FOREIGN PATENT DOCUMENTS

| CN | 101854361 A | 10/2010 |
| CN | 102375853 A | 3/2012 |

(Continued)

OTHER PUBLICATIONS

Office Action dated Sep. 5, 2019 for European Patent Application No. 15884267.4, 8 pages.
(Continued)

*Primary Examiner* — Suraj M Joshi
(74) *Attorney, Agent, or Firm* — Schwabe, Williamson & Wyatt, P.C.

(57) ABSTRACT

Methods, apparatuses, and storage media associated with compaction of data from one or more computing devices are disclosed. In various embodiments, one or more Internet of Things (IoT) devices may transmit information to a computing system. The computing system may group together raw data received from these one or more IoT devices based on a shared attribute. The computing system may select a compaction scheme to represent the knowledge conveyed by a group of the raw data. The computing system may apply this compaction scheme to the group of raw data to generate data that is representative of the group of raw data. Other embodiments may be disclosed or claimed.

26 Claims, 10 Drawing Sheets

(51) Int. Cl.
  *G06F 3/06* (2006.01)
  *H04W 4/38* (2018.01)
  *H04W 4/70* (2018.01)
  *H03M 7/30* (2006.01)

(52) U.S. Cl.
  CPC ............ *G06F 3/0638* (2013.01); *H03M 7/30* (2013.01); *H03M 7/6076* (2013.01); *H03M 7/6088* (2013.01); *H04L 67/1095* (2013.01); *H04L 67/12* (2013.01); *H04L 67/2804* (2013.01); *H04L 67/2833* (2013.01); *H04L 69/04* (2013.01); *H04W 4/38* (2018.02); *H04W 4/70* (2018.02)

(56) References Cited

U.S. PATENT DOCUMENTS

| | | | |
|---|---|---|---|
| 2013/0311570 A1 | 11/2013 | Kuo | |
| 2014/0075095 A1* | 3/2014 | Manohar | G06F 12/0246 711/103 |
| 2014/0145866 A1* | 5/2014 | Lee | H03M 7/30 341/87 |
| 2016/0085766 A1* | 3/2016 | Kushtagi | G06F 16/1744 707/689 |

FOREIGN PATENT DOCUMENTS

| | | | | |
|---|---|---|---|---|
| CN | 0N103580871 A | 2/2014 | | |
| TW | 201301209 A | 1/2013 | | |
| TW | 201421916 A | 6/2014 | | |
| WO | WO01/61543 A1 | 8/2001 | | |
| WO | WO-0161543 A1 * | 8/2001 | ............... | G06T 9/00 |
| WO | WO2014/169956 A1 | 10/2014 | | |

OTHER PUBLICATIONS

Extended European Search Report dated Aug. 3, 2018 for European Patent Application No. 15884267.4, 10 pages.

Office Action dated Apr. 1, 2019 for European Patent Application No. 15884267.4, 8 pages.

International Search Report and Written Opinion dated Dec. 21, 2015 for International Application No. PCT/CN2015/074093, 15 pages.

Office Action dated Mar. 21, 2017 for U.S. Appl. No. 14/911,223, 20 pages.

Final Office Action dated Aug. 9, 2017 for U.S. Appl. No. 14/911,223, 12 pages.

* cited by examiner

| x | Y | DEV[ x ] |
|---|---|---|
| 1 | 732.1899 | -6.6% |
| 2 | 811.7641 | 3.5% |
| 3 | 740.8266 | -5.5% |
| 4 | 825.9971 | 5.3% |
| 5 | 822.7612 | 4.9% |
| 6 | 734.0541 | -6.4% |
| 7 | 795.1972 | 1.4% |
| 8 | 810.4417 | 3.4% |

METHOD AND APPARATUS FOR COMPACTION OF DATA RECEIVED OVER A NETWORK

RELATED APPLICATIONS

The present application is a continuation of U.S. application Ser. No. 14/911,223 filed Feb. 9, 2016, entitled "METHOD AND APPARATUS FOR COMPACTION OF DATA RECEIVED OVER A NETWORK", now U.S. Pat. No. 10,015,272 issued Jul. 3, 2018 which is a national phase entry under 35 U.S.C. § 371 of International Application No. PCT/CN2015/074093, filed Mar. 12, 2015, entitled "METHOD AND APPARATUS FOR COMPACTION OF DATA RECEIVED OVER A NETWORK", which designated, among the various States, the United States of America. The contents of PCT/CN2015/074093 and U.S. Ser. No. 14/911,223 are hereby fully incorporated by reference in their entireties.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Data from various computing devices may stream at unprecedented rates. As millions of devices may send data many times (e.g., at rates of several times each second, minute, etc.), the volume of data that must be processed, indexed, and stored raises severe economic and technical hurdles in provisioning storage capacity and bandwidth.

Compression may be one approach to managing such voluminous data. In compression, original data may be stored using a reduced number of bits. Compression may be lossy or lossless. In lossy compression, the number of bits required to store original data may be reduced by discarding "unimportant" data. In lossless compression, original data may be compressed by eliminating statistically redundant data so that data may be decompressed to exactly its original value. However, compression still requires appreciable storage capacity and so alternative approaches to data storage reduction may be examined.

BRIEF DESCRIPTION OF THE DRAWINGS

Embodiments of the present invention will be described by way of exemplary embodiments, but not limitations, illustrated in the accompanying drawings in which like references denote similar elements, and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, descriptions of operations as separate operations should not be construed as requiring that the operations be necessarily performed independently and/or by separate entities. Descriptions of entities and/or modules as separate modules should likewise not be construed as requiring that the modules be separate and/or perform separate operations. In various embodiments, illustrated and/or described operations, entities, data, and/or modules may be merged, broken into further sub-parts, and/or omitted.

The phrase "in one embodiment" or "in an embodiment" is used repeatedly. The phrase generally does not refer to the same embodiment; however, it may. The terms "comprising," "having," and "including" are synonymous, unless the context dictates otherwise. The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)."

Figure 1:
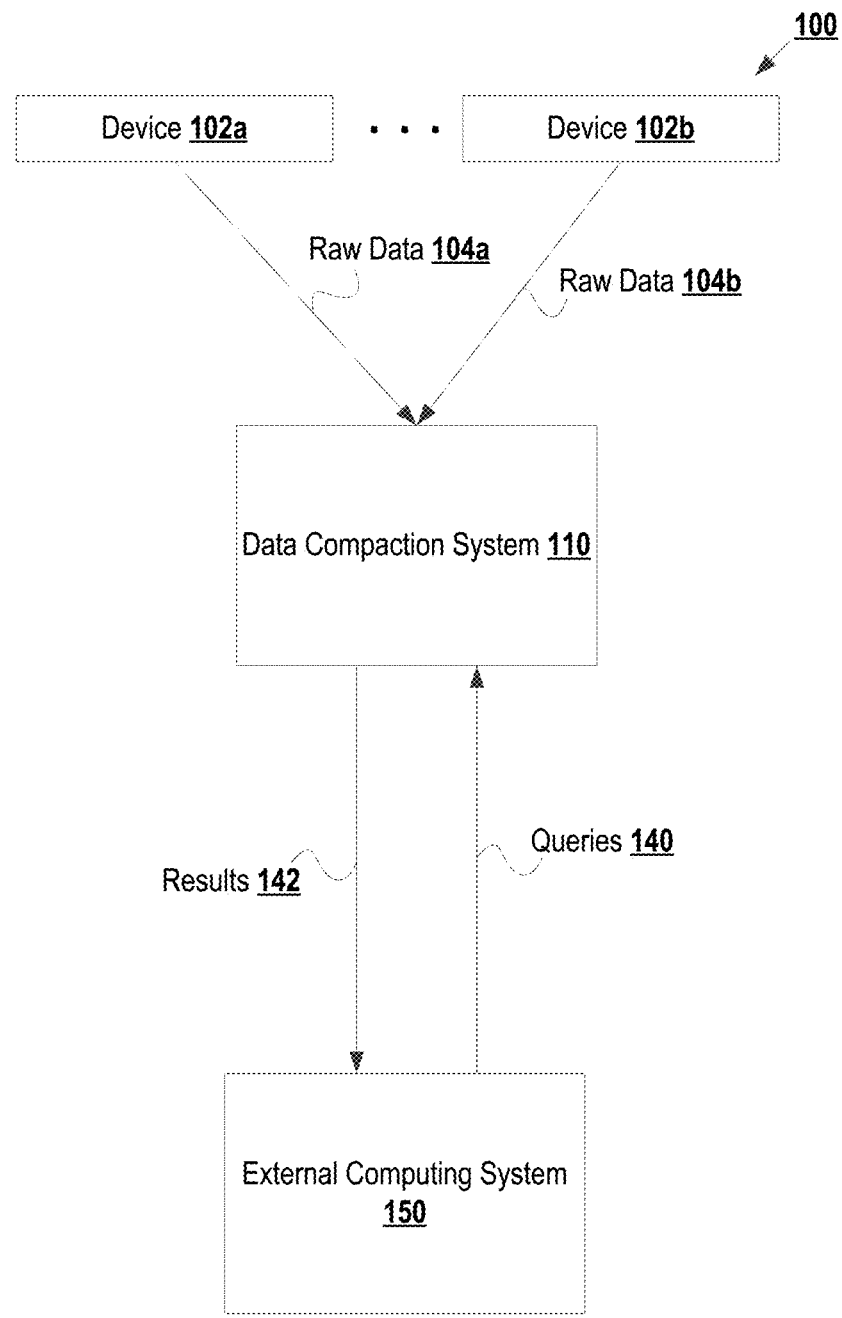
FIG. 1 is a block diagram illustrating an example environment that includes a system for compacting data received from a plurality of devices, in accordance with various embodiments.

FIG. 1 illustrates an example environment 100 that includes a system 110 for compacting data received from a plurality of devices 102a-b, according to teachings of the present disclosure. The environment 100 may include, but is not limited to, one or more devices 102a-b, an external computing system 150, and a data compaction system 110, which may incorporate the teachings of the present disclosure. The devices 102a-b and the external computing system 150 may be communicatively coupled with the data compaction system 110 at least as shown, for example, over one or more wired and/or wireless networks, including the Internet.

In various embodiments, each of the devices 102a-b may be an Internet of Things (IoT) device. Examples of IoT devices include phones, smartphones, medical gadgets, meters or gauges (e.g., energy, temperature, humidity, pulse rate, pressure, voltage, current gauges, etc.), appliances, vehicles (e.g., Internet of Vehicles (IoV) devices), or essentially any other device configured with an embedded computing device operable to transmit data over a network (e.g., the Internet). In some embodiments, IoT devices may include cooperative mobile devices, such as devices configured to share data, resources, and/or processing functionality.

In embodiments, the devices 102a-b may be configured to capture raw data comprising a plurality of values. The devices 102a-b may lack disk storage and may only include respective NAND or NOR flash of relatively small capacity that may be reserved for memory. Therefore, data compaction may efficiently represent raw data captured by the devices 102a-b. The raw data 104a-b provided by the devices 102a-b may be expected to exhibit a variety of characteristics that may be leveraged for efficient data representation: (1) bounded deviation, (2) threshold sensitivity, and (3) skew.

With respect to bounded deviation, changes in values comprising the raw data 104a-b from the devices 102a-b are frequently limited in magnitude over small time periods. That is, relatively large changes in values read by one of the devices 102a-b may occur occasionally, but relatively small changes in values in relatively small time periods are to be expected. The devices 102a-b may be configured to adapt and/or to compensate for various readings over relatively short time periods. For example, methane ($CH_4$) and/or carbon dioxide ($CO_2$) emission rates may be read by one of the devices 102a-b and oscillations in values may be detected, for example, in a diurnal cycle. Similarly, one of the devices 102a-b may be configured to detect temperature, and the detected temperature may gradually vary second by second.

With respect to threshold sensitivity, a signal detected by one of the devices 102a-b may exceed a threshold value in either direction relative to a central value in order to convey information. In embodiments, the devices 102a-b may include respective sensitivity thresholds. For example, one of the devices 102a-b may be a camera configured to detect traffic. The ability of the one of the devices 102a-b to capture license plates, driver faces, etc. (e.g., resolution), may not be germane for traffic analytics; rather, a relative change in traffic congestion may be useful for traffic analytics (e.g., raw data 104a-b may convey whether traffic has increased by a threshold percentage over a certain duration).

With respect to skew, the devices 102a-b may convey raw data 104a-b that indicates mass around one or more bands close to a central value, while other values conveyed by the raw data 104a-b in bands farther away from the central value may be relatively infrequent. For example, a commonly occurring Normal distribution may have 68.2% mass in a $\pm\sigma$ band and 95.4% mass in the $\pm2\sigma$ about the mean. The prevalence of skew in deviations indicates that small numbers of quantizations may be sufficient to capture critical gradations in data.

The concepts of bounded deviation, threshold sensitivity, and/or skew may be leveraged for efficient data representation. In embodiments, one or more compaction schemes may be based on one or more of bounded deviation, threshold sensitivity, and/or skew. For example, skew in combination with threshold sensitivity may be conducive to a compaction scheme comprising a coarse-grained bitmap that is sufficient to detect threshold value crossings.

In embodiments, each of the devices 102a-b may transmit raw data 104a-b to the data compaction system 110. For example, the devices 102a-b may stream the raw data 104a-b to the data compaction system 110 at a relatively high rate (e.g., many times each second or minute).

Except for the teachings of the present disclosure, the data compaction system 110 may be an edge device. Examples of edge devices include routers, routing switches, integrated access devices (IADs), multiplexers, and so forth. In another embodiment, the data compaction system 110 may be communicatively coupled with one or more edge devices to receive raw data 104a-b from the devices 102a-b. In such embodiments, the data compaction system 110 may be included in a server, a desktop computer, a laptop computer, or essentially any other computer device adapted to transmit signals over a network.

According to embodiments, the data compaction system 110 may be configured to apply at least one compaction scheme to the raw data 104a-b to represent that raw data 104a-b. Compaction of the raw data 104a-b may allow an edge device to retain more data without communication with a block device (e.g., a storage device, such as a hard disk drive, CD-ROM drive, and/or flash drive).

In various embodiments, the data compaction system 110 may comprise circuitry and/or logic to group values included in the raw data 104a-b based on at least one attribute associated with at least one of the devices 102a-b. The data compaction system 110 may select at least one compaction scheme based on the values of the group and generate representative data based on application of the selected at least one compaction scheme to the values of the group. Accordingly, the data compaction system 110 may select and apply domain-appropriate compaction schemes. Further, the data compaction system 110 may adapt to domain and/or raw data 104a-b, for example, through dynamic selection of a compaction scheme. The data compaction system 110 may be configured to store the representative data, for example, in a table of a database included in or communicatively coupled with the data compaction system 110.

The environment 100 may further include an external computing system 150. According to embodiments, the external computing system 150 may be a server, a desktop computer, a laptop computer, or essentially any other computer device adapted to transmit signals over a network. The external computing system 150 may be configured to transmit one or more queries 140 to the data compaction system 110. In various embodiments, the one or more queries 140 may be, for example, database queries.

In response to the one or more queries 140, the data compaction system 110 may be configured to identify responsive data to transmit to the external computing system 150 as results 142. In some embodiments, the data compaction system 110 may identify raw data from raw data 104a-b as responsive data and transmit the same to the external computing system 150 as results 142.

In some embodiments, the data compaction system 110 may be configured to generate the responsive data based on the representative data. According to various embodiments, the representative data may include an indication of how to generate the responsive data, such as a function and/or a bitmap index. Based on the query, the data compaction system 110 may identify representative data and generate responsive data based on the representative data to transmit to the external computing system 150 as results 142. For example, the data compaction system 110 may generate responsive data through a randomized algorithm for interpolation based on the representative data and/or application of a function indicated by the representative data.

Figure 2:
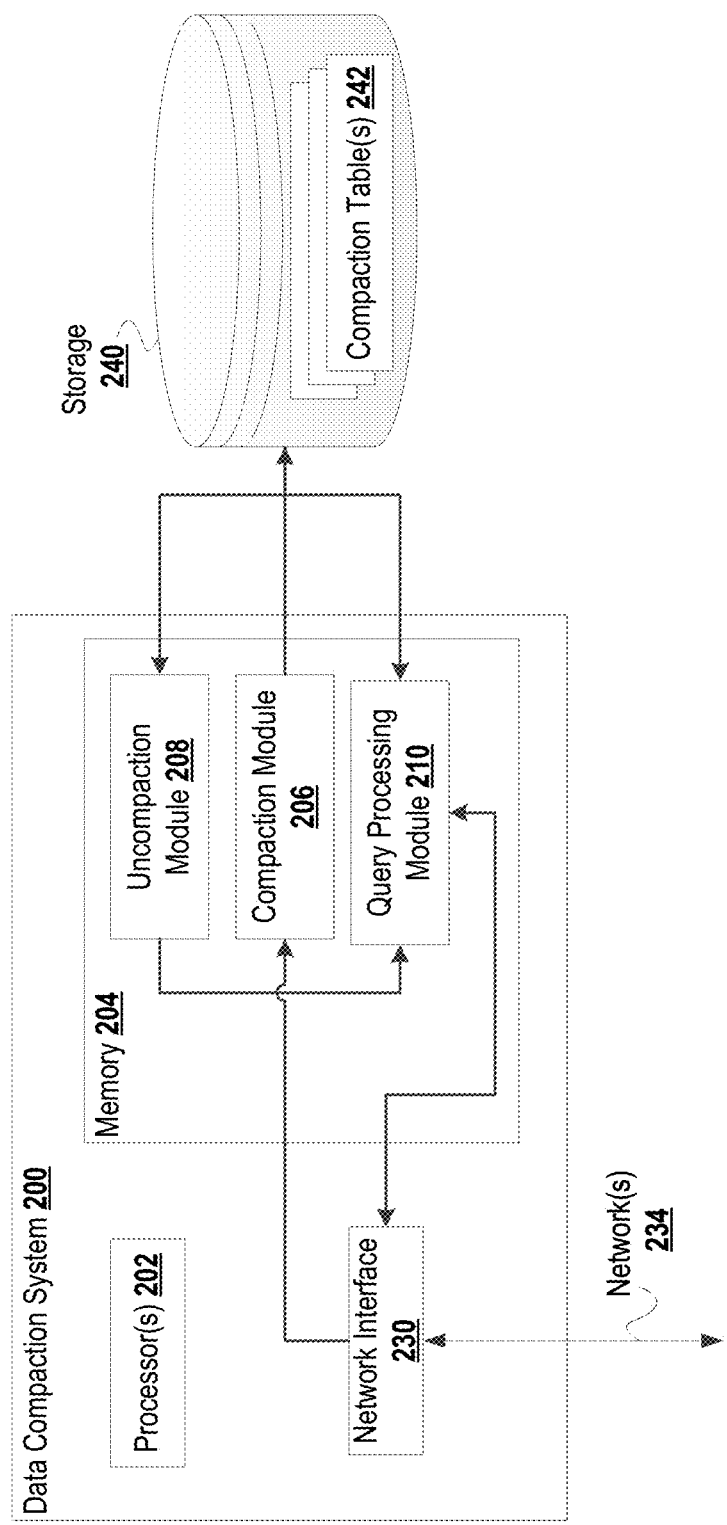
FIG. 2 is a block diagram illustrating a data compaction system that includes modules for data compaction, data uncompaction, and query processing, in accordance with various embodiments

Turning now to FIG. 2, a block diagram illustrates a data compaction system 200 that includes modules 206, 208, 210 for data compaction, data uncompaction, and query processing, in accordance with various embodiments. The data compaction system 200 may be an embodiment of the data compaction system 110, as illustrated in FIG. 1.

As shown, for the illustrated embodiments, the data compaction system 200 may include one or more processors 202, memory 204, and a network interface 230, coupled with each other at least as shown. The processor 202 may be configured to execute instructions of a compaction module 206, an uncompaction module 208, and a query processing module 210, loaded from memory 204. The compaction module 206, uncompaction module 208, and query processing module 210 may be implemented in software, hardware, firmware, or a combination thereof.

The processor 202 is intended to represent a broad range of processors, such as single or multi-core processors of various execution speeds and power consumptions. Similarly, the memory 204 is intended to represent memory of various architectures with one or more levels of caches, and of various types, such as dynamic random access, flash, and so forth. In some embodiments, the processor 202 and the memory 204 (as well as additional components) may be integrated, such as in a system on chip (SoC).

The network interface 230 may be comprised of transmit circuitry and/or receive circuitry. The network interface 230 may be configured to transmit and/or receive data over any number of different wired and/or wireless networks. Accordingly, the one or more network(s) 234 is (are) intended to represent a broad range of networks known in the art. Examples of network(s) 234 may include wired or wireless, local or wide area, private or public networks, including the Internet.

The data compaction system 200 may include or may be communicatively coupled with (e.g., over the network(s) 234) storage 240. The storage 240 is intended to represent any storage media suitable to store compacted data. Examples of the storage 240 include flash (e.g., NAND flash), electrically erasable programmable read-only memory (EEPROM), hard disk drive (HDD), and so forth. In some embodiments, the storage 240 may comprise a database. The storage 240 may include a plurality of compaction tables 242, for example, as tables in a database. The storage 240 may be configured to store both raw and compacted data.

In various embodiments, the network interface 230 may be configured to receive, over the network(s) 234, and process raw data from one or more IoT devices. The compaction module 206 may be provided this raw data by the network interface 230. The compaction module 206 may be configured to identify at least one attribute common to a plurality of values comprising the raw data and associated with the one or more of the IoT devices from which the raw data is received. For example, the compaction module 206 may be configured to detect an identifier associated with an IoT device (e.g., a device ID) so that the compaction module 206 may group together values from a same IoT device.

According to embodiments, the compaction module 206 may be configured to determine an amount of values comprising raw data to be grouped together. A first plurality of aggregated values may be within a discrete range and, therefore, may be conducive to compaction using a first compaction scheme, whereas another plurality of values may be disparate and, therefore, would be better suited by another compaction scheme.

In embodiments, the compaction module 206 may be configured to determine a compaction scheme that is to represent the first plurality of values. A compaction scheme may be any approach to attempting to reduce the storage consumed by the raw data through reduction of the actual information theoretic content without affecting the meaningful use of data.

Examples of compaction schemes include function fitting, piecewise fitting, relation to a principal value, and bitmap index compaction. In a function fitting compaction scheme, the compaction module 206 may be configured to construct a function (e.g., a linear or quadratic function) to aggregated values. Similarly, for a piecewise compaction scheme, the compaction module 206 may be configured to fit a piecewise linear function to aggregated values or a plurality of groups of aggregated values.

With respect to a compaction scheme based on relation to a principal value, the compaction module 206 may represent values based on their respective relationships to a principal value. For example, the compaction module 206 may select a principal value that is the mean of a group of aggregated values and each aggregated value may be represented by its percentage deviation from the principal value. In another embodiment, the compaction module 206 may observe that aggregated values are clustered around a principal value, such as a mean $\mu$. Based on aggregated values, the compaction module 206 may identify a standard deviation $\sigma$. Accordingly, aggregated values may be represented by a number of values within a standard deviation $\sigma$ (or a multiple thereof) from a mean $\mu$.

With respect to a compaction scheme based on a bitmap index, the compaction module 206 may be configured to populate one or more bitmap columns or rows based on aggregated values. For example, there may be eight possible bands over which an attribute associated with a group may be distributed. In one embodiment, an eight-column bitmap index may be populated based on the values to indicate aggregated values of a group. In another embodiment, e.g., if the skew is high, then a one-column bitmap index may be used to represent the aggregated values to indicate whether each value occurs in a high density band (an additional column may be populated to indicate whether an attribute occurs at all).

The compaction module 206 may be configured to dynamically select a compaction scheme in response to received raw data. In various embodiments, the compaction module 206 may be configured to aggregate values comprising the raw data and may be configured to select various compaction schemes for different aggregations of values. For example, the compaction module 206 may be configured to select a first compaction scheme for a long, tranquil section of raw data from an IoT device, but switch to a second compaction scheme for a jittery section of raw data from the same IoT device, and finally return to the first compaction scheme for a third section of raw data. In another example, the compaction module 206 may apply a function fitting compaction scheme to one or more sections of values of a group, but may adaptively blend in deviation encoding to module precision in data fitting.

The compaction module 206 may be configured to apply at least one selected compaction scheme to a plurality of values, such as aggregated values of a group. Application of a selected compaction scheme to a plurality of values may cause the compaction module 206 to generate representative data. The representative data generated by the compaction module 206 may vary according to the selected compaction scheme. For example, the representative data may be a function, a bitmap index, a principal value, and so forth. The representative data may further include an indication of a number of values comprising raw data represented by the representative data. In embodiments, the compaction module 206 may further generate the representative data to include other values, such as a minimum value, maximum value, and so forth.

The compaction module 206 may be configured to store representative data in the storage 240, for example, in at least one compaction table 242. Because the compaction module 206 may be configured to apply varying compaction schemes to different values of a group, the compaction module 206 may be configured to store different representative data in different columns of one or more compaction tables 242 or even different representative data in a same column of one of the compaction tables 242.

In some embodiments, the compaction module 206 may be configured to store raw data in the storage 240. For example, if the compaction module 206 is unable to select a compaction scheme and/or determines that certain raw data is unsuitable for compaction, the compaction module 206 may be configured to store that raw data in the storage 240. However, in one embodiment, the compaction module 206 may be configured to discard raw data, for example, after representative data is generated to indicate that raw data.

The compaction module 206 may be further configured to apply data compression to one or both of raw data and/or representative data. For example, the compaction module 206 may be configured to apply bitmap compression (e.g., word-aligned hybrid) to a bitmap index of representative data.

In various embodiments, the network interface 230 may be configured to receive, over the network(s) 234, and process one or more queries from an external computing system. In various embodiments, the query may comprise a request for data associated with one or more IoT devices. For example, a query may indicate an attribute according to which raw data may have been grouped (e.g., an attribute associated with representative data). In various embodiments, the query may comprise a database query.

The query processing module 210 may be configured to receive one or more queries from the network interface 230. In various embodiments, the query processing module 210 may comprise a database management system (DBMS). Examples of DBMSs include Oracle of Oracle Corporation, headquartered in Santa Clara, Calif., Postgres of PostgreSQL Global Development Group, and Hbase of the Apache Software Foundation, headquartered in Forest Hill, Md. However, the query processing module 210 may be configured for use based on relatively stringent requirements of the processor 202, memory 204, and/or storage 240, for example, where the data compaction system 200 is included in an edge device with limited processor and/or memory bandwidth.

In some embodiments, the query processing module 210 may be configured to access the storage 240 based on a query. For example, the query processing module 210 may be configured to respond to a query with raw data. Thus, the query processing module 210 may be configured to respond to a "retrieve all" query so that all data is returned by the storage 240.

In various embodiments, the query processing module 210 may be configured to interact with the uncompaction module 208, for example, to retrieve data with which to respond to a query. The uncompaction module 208 may be configured to generate data (e.g., responsive data) based on representative data stored in one of the compaction tables 242. For example, the uncompaction module 208 may be configured to generate a set of values based on representative data stored in one of the compaction tables 242, and the representative data may indicate the number of values to be generated. In embodiments, the uncompaction module 208 may not exactly duplicate values of raw data; however, the uncompaction module 208 may un-compact the representative data so that salient information is generated, for example, for analytics.

In one embodiment, the uncompaction module 208 may be configured to generate values based on a function. For example, representative data may comprise a function and a number of values for which that function is valid. According, the uncompaction module 208 may be configured to generate the number of values using the function and provide those values to the query processing module 210 as data response to a query. Similarly, for a piecewise compaction scheme, the uncompaction module 208 may be configured to generate a plurality of values using a piecewise linear function.

With respect to a compaction scheme based on relation to a principal value, the uncompaction module 208 may generate values based on their respective relationships to a principal value. For example, the representative data may include a principal value, an indication of a number of values represented by the representative data, and respective deviations for each of the values from the principal value. Accordingly, the uncompaction module 208 may calculate each value of the number of values based on each deviation from the principal value.

In another embodiment, the uncompaction module 208 may be configured to interpolate values based on the representative data. For example, the uncompaction module 208 may be configured to generate values based on a randomization function that constrains each generated random value to within a deviation (or a multiple thereof) from the principal value.

With respect to representative data comprising a bitmap index, the uncompaction module 208 may be configured to generate values based on columns or rows based on aggregated values. For example, the uncompaction module 208 may be configured to generate values in one or more bands based on one or more bitmaps that indicate whether such values occurred in the one or more bands in raw data.

The uncompaction module 208 may be configured to provide data based on un-compaction of representative data (e.g., generated data) to the query processing module 210. Accordingly, the query processing module 210 may be configured to respond to one or more queries with that data provided by the uncompaction module 208.

Figure 3:
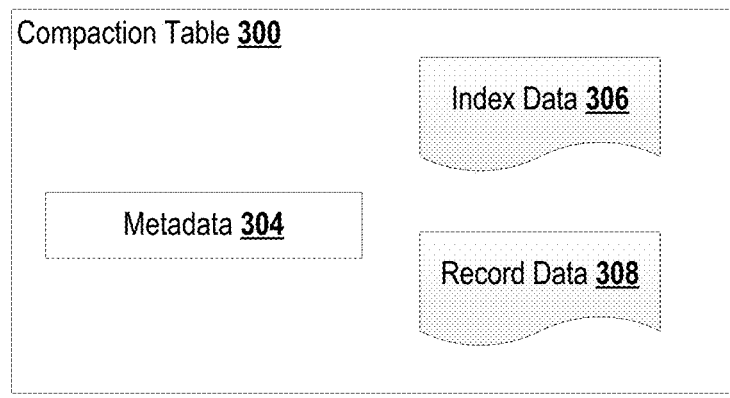
FIG. 3 is a block diagram illustrating an example compaction table for storing representative data, in accordance with various embodiments.

Now with reference to FIG. 3, a block diagram illustrates an example compaction table for storing representative data, in accordance with various embodiments of the present disclosure. In relation to embodiments described in FIG. 2, the compaction table 300 may be an embodiment of one of the compaction tables 242 and the compaction module 206 may be configured to populate data in the compaction table 300.

In embodiments, the compaction table 300 may be comprised of a plurality of structures: metadata 304, index data 306, and record data 308. The metadata 304 may describe how the compaction table 300 is stored and/or organized. The metadata 304 may include a metadata structure (or map) that includes information describing policies, attributes, and/or properties of the listed attributes.

In some embodiments, the metadata 304 may describe a key generation policy, an aggregation policy, a data ordering policy, group attributes and their properties, and compacted attributes and their properties. The key generation policy may describe how to automatically generate new unique keys for a new record that is a compaction of data from raw data (e.g., representative data). The key generation policy may specify a namespace and a mapping of keys between raw data and representative data.

The aggregation policy of the metadata 304 may describe the criteria by which raw data is compacted and/or stored as raw data. For example, a simple criterion may include a policy to compact sixteen consecutive records of raw data for a first attribute or compact all records of raw data for another attribute that spans one minute. More complex criteria may include conditions governing loss of precision, magnitude of deviation from compacted representation, and so forth. The data ordering policy may describe how records of raw data in a same group are ordered before compaction—e.g., by timestamp, original key values, and so forth.

The metadata 304 may further identify group attributes and properties. A group attribute may identify an attribute in raw data on which compaction is performed. Properties of a group attribute may include what data type it is and how it may be transformed into a new attribute through compaction—e.g., individual absolute magnitude values of raw data may be transformed into deviations from a principal value. In embodiments, compaction of values may be independent across different attributes and, therefore, there may be a plurality of group attributes.

For each group attribute, the metadata 304 may identify an aggregation attribute associated with compacted data (e.g., representative data) that carries the transformed value. Properties of an aggregation attribute may include the type of attribute before and after compaction, a compaction scheme and an un-compaction scheme, and parameters for respective schemes. A compaction scheme may be explicitly indicated (e.g., "linear function fitting"), or may be specified by a set of parameterized rules (e.g., an indication of how a compaction module is to select a compaction scheme, such as an indication that a compaction scheme is to be selected only if preserves accuracy of the raw data to greater than or equal to 0.975). In embodiments of parameterized rules, a compaction module may decide, based on raw data, which compaction scheme yields acceptable results and apply it for compaction.

In embodiments, the index data 306 may maintain various indexing systems adapted for compacted data so that suitable data is un-compacted, for example, in response to one or more queries. Because compaction reduces the volume of data both in bit size and number of stored values, indices can be reduced in breadth but carry more depth. Aggregation attributes (stored as part of record data 308) effectively may be a type of index since they summarize data over a span and therefore allow an entire span to be skipped if summaries show no intersection with the parameters of a query. The index data 306 may include indices such as trees, tries, hashes, table index, as well as bitmap indices.

The record data 308 may store compacted data (e.g., representative data). Record data 308 may further include raw data, for example, that was not compacted due to an unsuitable match with existing compaction schemes. Record data 308 may further comprise other summarization data, such as statistics gathered over raw data (e.g., minimum value, maximum value, cardinalities, variances, etc.) that may be employed for un-compaction and/or query processing. For example, when scope filtering (e.g., include values between a minimum and a maximum over a range) is possible over an aggregation attribute, statistical information may facilitate filtering without un-compaction.

Figure 4:
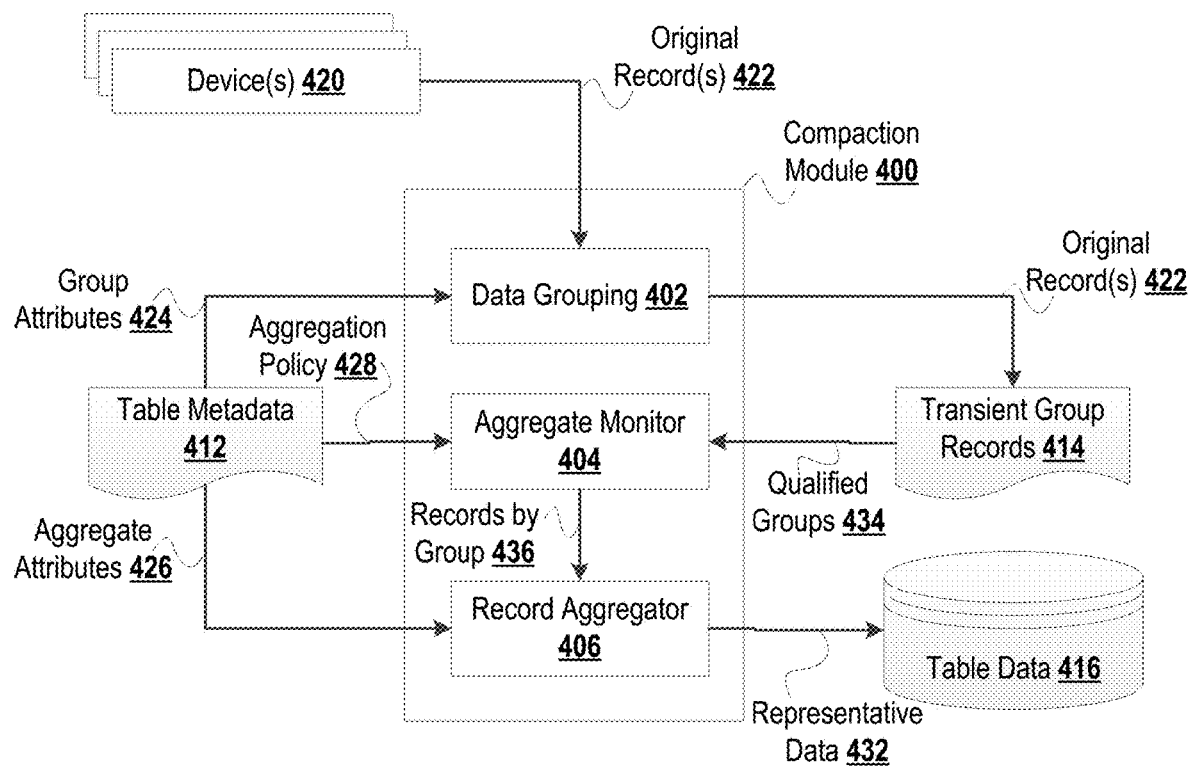
FIG. 4 is a block diagram illustrating example operations associated with compaction of data from a plurality of devices, in accordance with various embodiments.

Turning to FIG. 4, a block diagram illustrates operations associated with compaction of data from a plurality of IoT devices 420, in accordance with various embodiments. In relation to FIG. 2, the compaction module 400 may be an embodiment of the compaction module 206 and the table data 416 may be an embodiment of the compaction tables 242.

In embodiments, as raw data is received from the plurality of IoT devices 420, the data grouping module 402 may be configured to group records (e.g., values) of raw data according to group attributes 424 as indicated in the table metadata 412. The data grouping module 402 may store these grouped original records 422 of the raw data in storage for transient group records 414.

Thereafter, an aggregate monitor module 404 may receive an aggregation policy 428 from table metadata 412 and use the aggregation policy 428 to select and retrieve qualified groups 434 from the transient group records 414. The aggregate monitor module 404 may then provide the qualified groups 434 to a record aggregator 406 as grouped records 436. The record aggregator 406 may apply aggregate attributes 426 from the table metadata 412 to build aggregated records, such as through application of a compaction scheme to generate representative data. Further, the record aggregator 406 may use a key generation policy from the table metadata 412 to associate the aggregated records with new keys. Finally, the record aggregator 406 may store aggregated records in connection with key association in the table data 416 as representative data 432.

Figure 5:
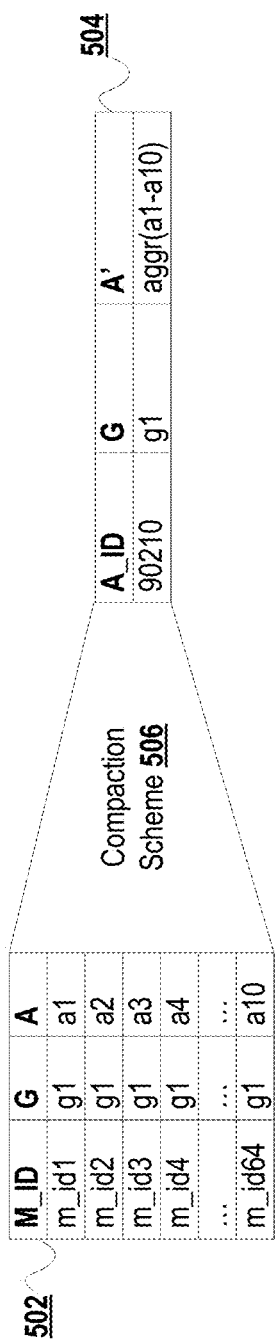
FIG. 5 is a block diagram illustrating an example of generation of representative data, in accordance with various embodiments.

With respect to FIG. 5, a block diagram illustrates an example of generation of representative data, in accordance with various embodiments. In embodiments, original records 502 comprising raw data may include three fields: a key field (M_ID), a group attribute field (G), and an attribute value (A). Similarly, an aggregated record 504 comprising representative data may include three fields: a new key of an aggregated record comprising (A_ID), the group attribute (G), and the compacted attribute value (A').

In the original records 502 comprising raw data, all original records 502 having the same group attribute g1 are grouped together. In the illustrated embodiment, the sixty-four records 502 comprising raw data include ten unique attribute values a1-a10. A compaction scheme 506 may be applied to the grouped original records 502 to represent the unique values a1-a10 of the sixty-four original records 502. Application of the compaction scheme may cause an aggregated value aggr(a1-a10) to be generated. This aggregated value may be stored in the aggregated record 504 comprising representative data, in connection with the new key 901210 and the group attribute g1.

Figure 6:
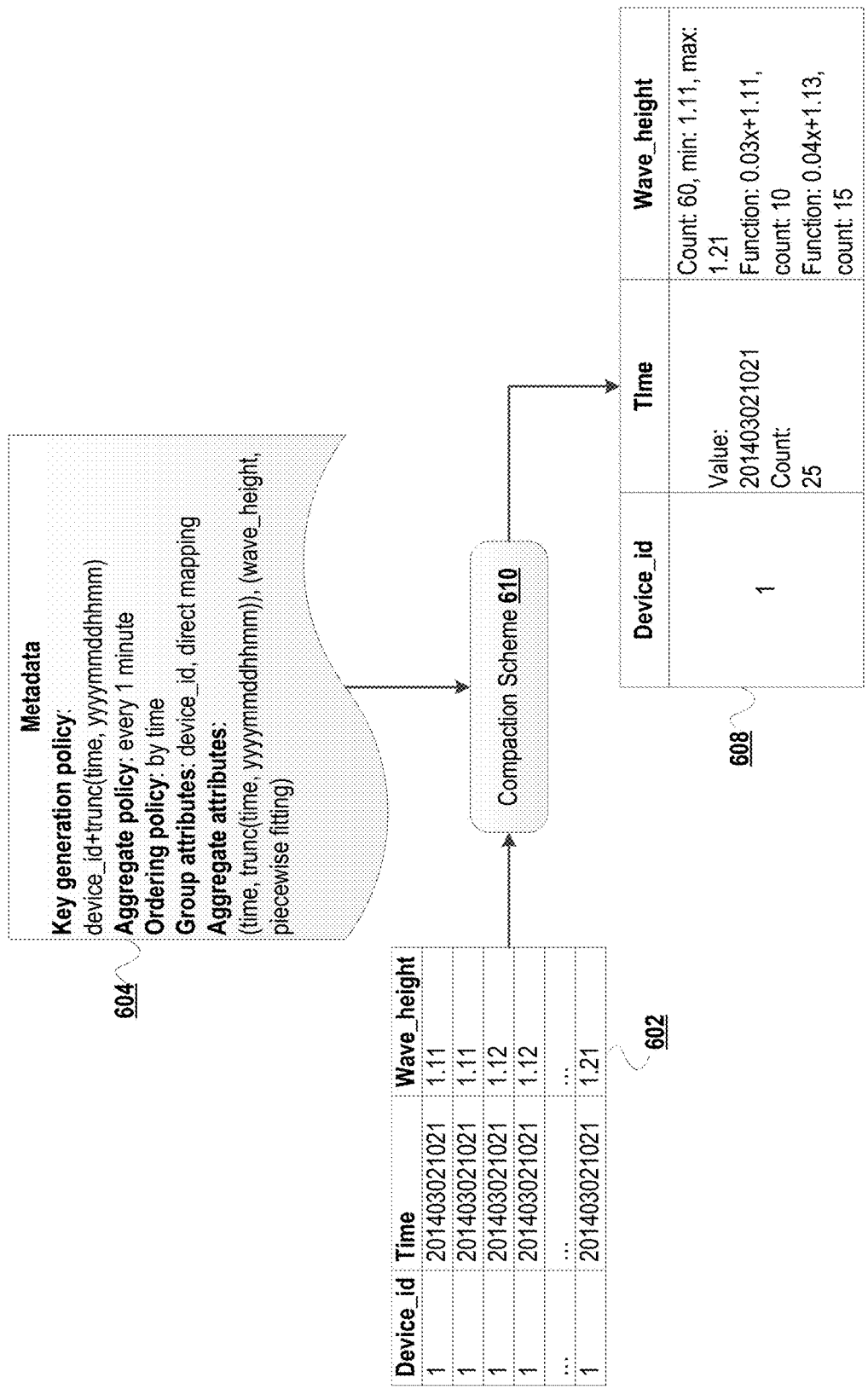
FIG. 6 is a block diagram illustrating another example of generation of representative data, in accordance with various embodiments.

Similarly, FIG. 6 depicts a block diagram illustrating another example of generation of representative data based on raw data, in accordance with various embodiments. As illustrated, original records 602 comprising raw data from a buoy sensor may include three fields: a device identification field (Device_id), a time field (Time and in format of yyyymmddhhmmss), and value (Wave_height). In the illustrated embodiment, the original records 602 may be grouped according to a single device ID 1, and twenty-five records 602 may be processed over a one minute interval.

In embodiments, a compaction scheme 610 may be applied to the original records 602. Application of the compaction scheme 610 may be based on metadata 604 that may describe how the compaction scheme 610 is to be applied and/or how representative data is to be generated therefrom and/or stored. In the illustrated embodiment, the metadata 604 may include a key generation policy describing how to generate a key associated with representative data based on the device ID and the time of the original records 602, an aggregation policy describing a number of records to which the compaction scheme 610 is to be applied, an ordering policy describing how the records are to be ordered (e.g., sequentially by time), a group attribute describing an attribute over which the original records are grouped and whether that attribute is affected during application of the compaction scheme 610, and other aggregation attributes describing the type of compaction scheme to be applied (e.g., piecewise fitting) and what field the compaction scheme is to be applied (e.g., wave height).

Based on application of the compaction scheme 610, an aggregated record 608 comprising representative data is generated. This aggregated record 608 may include a device ID field indicating an identification of the buoy sense represented in the aggregated record 608, a time field indicating a time represented in the aggregated record 608 and a number of original records 602 comprising raw data represented in the aggregated record 608, and a field for compacted data. Because the compaction scheme is applied to the wave height field of the original records 602, the field for compacted data is also wave height. In this field, piecewise fitting through the compaction scheme 610 has generated two functions: one function representing ten of the original records 602 and another function representing fifteen of the original records 602. Other statistical data may be represented in this field, such as a minimum value, a maximum value, and/or a number of values that may be generated based on the representative data.

Figure 7:
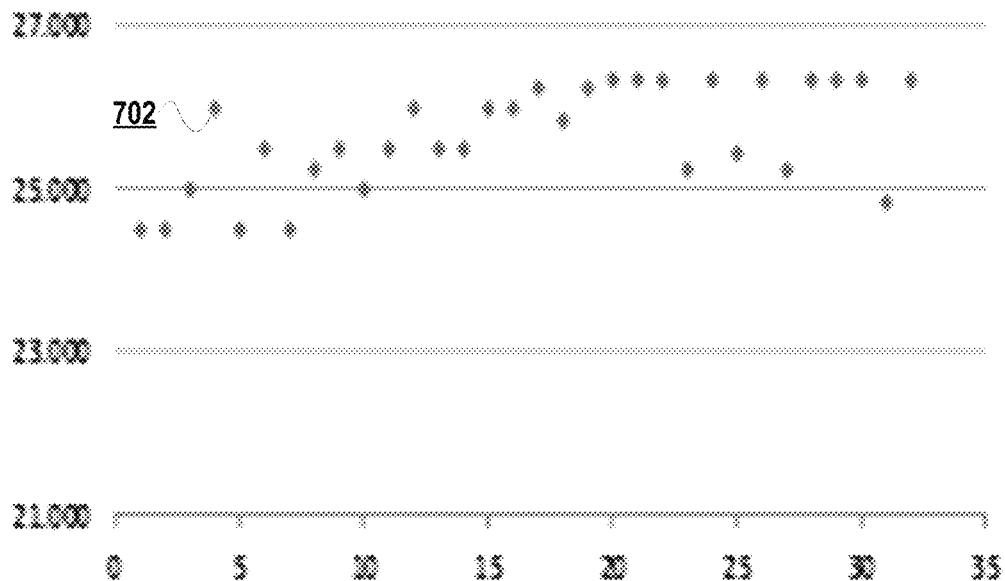
FIG. 7 is a graph illustrating a set of readings from at least one Internet of Things device, in accordance with various embodiments.

In reference to FIGS. 7-10, a plurality of graphs illustrate results of different applications of compaction schemes to original records, in accordance with various embodiments. In FIG. 7, a graph illustrates readings 702 overs a three-second interval from a power meter on the vertical axis. Readings 702 from the power meter are illustrated as thirty-two dots. The readings 702 indicate a slightly rising trend over the three-second interval, with some amount of oscillation around that trend.

Figure 8:
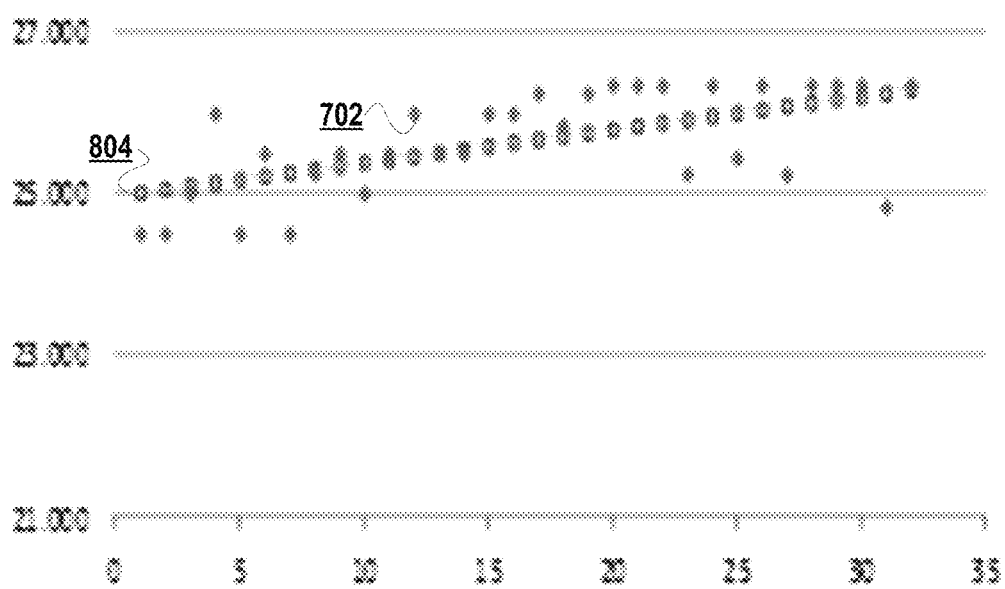
FIG. 8 is a graph illustrating a linear function fit to a set of readings from at least one Internet of Things device, in accordance with various embodiments.

In FIG. 8, the same data as FIG. 7 is illustrated but with a linear trend line 804 superimposed. In the illustrated embodiment, the linear trend line 804 may be the function $y=0.041x+24.97$. Accordingly, capturing just two parameters may provide a compact approach to representing thirty-two readings 702. The loss of precision through representation of the readings 702 with a function represented by the linear trend line 804 may be sufficient to convey the information indicated by the readings 702.

Figure 9:
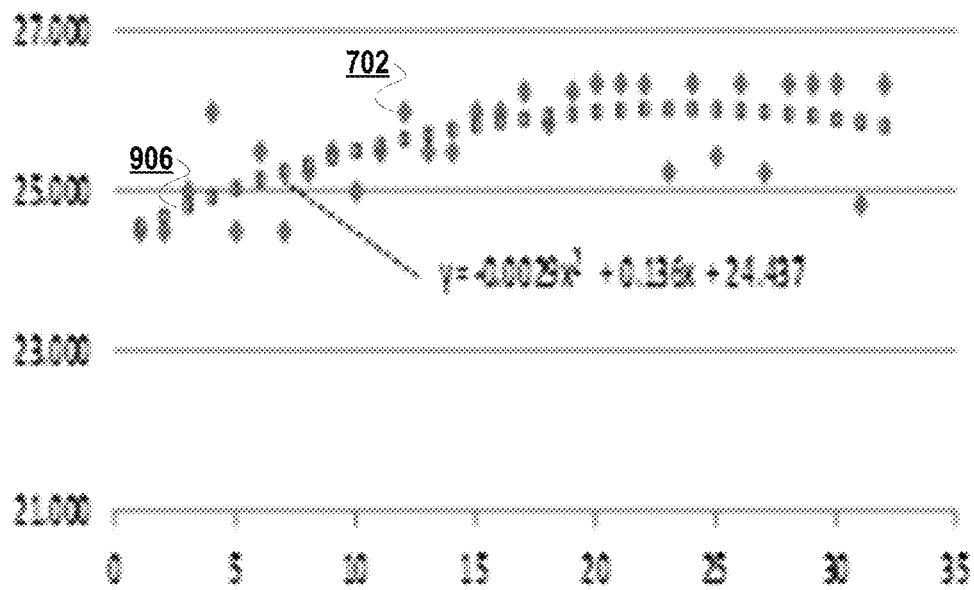
FIG. 9 is a graph illustrating a quadratic function fit to a set of readings from at least one Internet of Things device, in accordance with various embodiments.

Similarly, in FIG. 9, the same data as FIG. 7 is illustrated but with a more snug quadratic fit. In the illustrated embodiment, the quadratic line 906 may be the function $y=-0.0029x^2+0.136x+24.437$. Accordingly, capturing three parameters may provide a compact approach to representing thirty-two readings 702. The loss of precision through representation of the readings 702 with a function represented by the quadratic line 906 may be sufficient to convey the information indicated by the readings 702. The storage savings provided through compaction may compound dramatically as the dimensionality of data increases.

Figure 10:
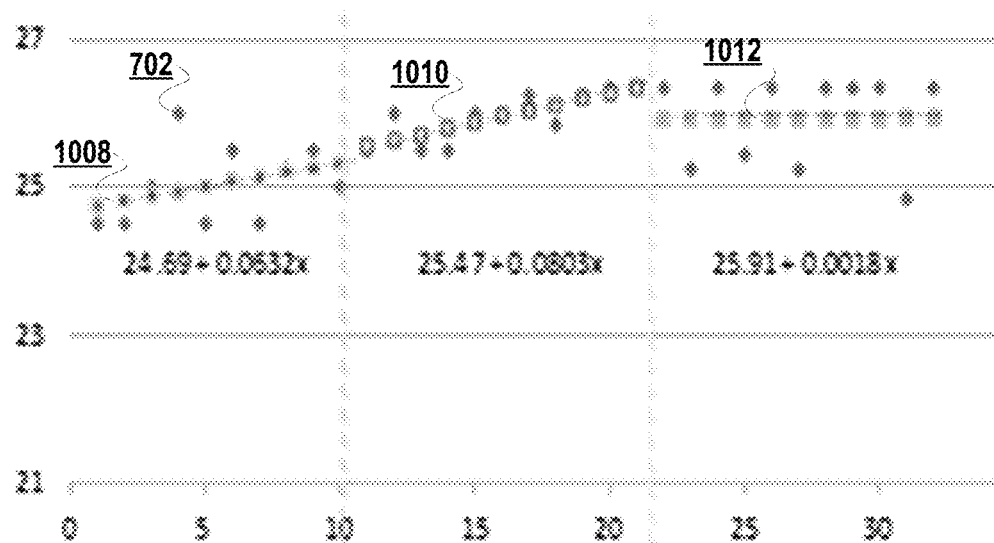
FIG. 10 is a graph illustrating a piecewise fit to a set of readings from at least one Internet of Things device, in accordance with various embodiments.

Similarly, in FIG. 10, the same data as FIG. 7 is illustrated but with piecewise linear fitting. In the illustrated embodiment, a first linear function line 1008 may be the function $y=0.0632x+24.437$, a second linear function line 1010 may be the function $y=0.0803x+25.47$, and a third linear function line 1012 may be the function $0.0018x+25.91$. Accordingly, capturing six parameters across three linear functions may provide a compact approach to representing thirty-two readings 702. The loss of precision through representation of the readings 702 with a function represented by the piecewise linear functions may be sufficient to convey the information indicated by the readings 702. In other embodiments, a piecewise fit may be negative in some instances to achieve a closer fit with data. Further, intervals of a piecewise fit may be of variable length in order to achieve both a close fit and data reduction.

Figure 11:
FIG. 11 is a graph illustrating an example representation of values based on respective relationships to a principal value, in accordance with various embodiments.

In reference to FIG. 11, a graph illustrates application of compaction schemes based on association of values comprising raw data to a principal value, in accordance with various embodiments. In some embodiments, a function may not fit data snugly, such as when readings oscillate around a mean value. In the embodiment of FIG. 11, a compaction scheme that represents values as their relationship to a principal value (e.g., a mean value) may appreciably decrease storage overhead. Here, representation of each the values 1120 as a percentage deviation from a mean value is a fraction of the storage required to represent the actual value (e.g., eight bits may be sufficient to capture DEV[x] using a scaled integer). Other compaction schemes not represented in the graphs of FIGS. 7-11 may be employed, such as a bitmap index.

Figure 12:
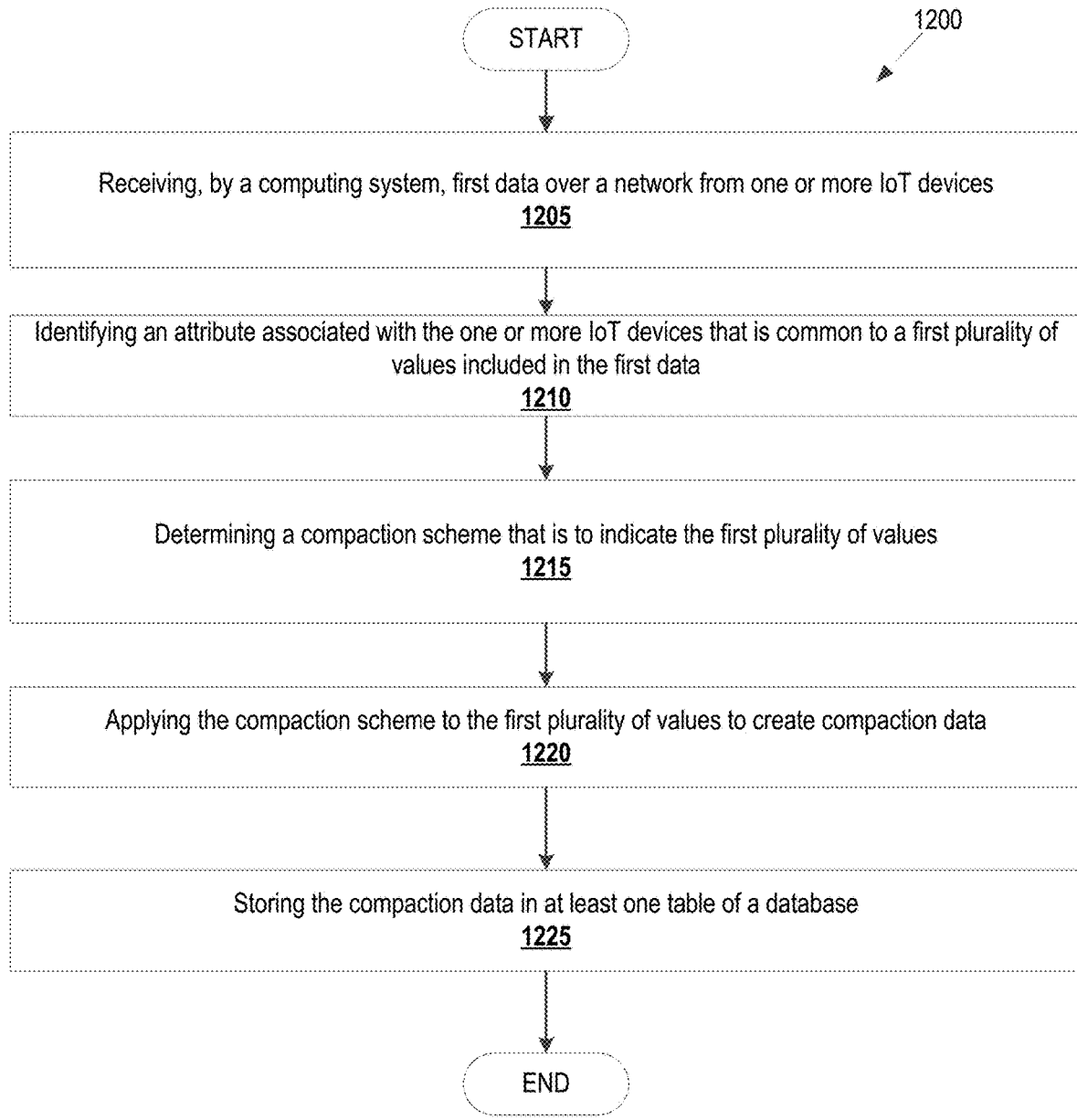
FIG. 12 is a flow diagram illustrating a method for compacting data from one or more Internet of Things devices, in accordance with various embodiments.

Referring now to FIG. 12, a flow diagram illustrates another method 1200 for compacting data received from one or more IoT devices, in accordance with various embodiments of the present disclosure. The method 1200 may be practiced in one or more computing systems described in the present disclosure, such as the data compaction systems 110 and 200 of FIGS. 1-2. While the method 1200 illustrates a plurality of sequential operations, one of ordinary skill would recognize that one or more operations of the method 1200 may be omitted and/or transposed.

The method 1200 may begin with an operation 1205 for receiving, by a computing system, first data over a network from one or more IoT devices. At operation 1210, the method 1200 may include identifying an attribute associated with the one or more IoT devices that is common to a first plurality of values included in the first data. Based on the first plurality of values, operation 1215 may include determining a compaction scheme that is to indicate the first plurality of values. Accordingly, operation 1220 may include applying the compaction scheme to the first plurality of values to create compaction data. Thereafter, operation 1225 may include storing the compaction data in at least one table of a database.

In various embodiments, example 1 may be a computing system for processing raw data from Internet of Things (IoT) devices, the system comprising: network interface circuitry to receive the raw data from the IoT devices over a network; one or more processors; physical memory, coupled with the one or more processors, to store a compaction module to be loaded into the physical memory for execution by the one or more processors; and the compaction module, coupled with the network interface circuitry, to: group values included in the raw data based on at least one attribute associated with at least one IoT device of the IoT devices; select at least one compaction scheme based on the values of the group; generate representative data based on application of the selected at least one compaction scheme to the values of the group. Example 2 may be the computing system of example 1, further comprising: a database, wherein the compaction module is to store the representative data in a table of the database. Example 3 may be the computing system of example 1, wherein the compaction module is to discard the values of the raw data. Example 4 may be the computing system of example 1, wherein at least one of the IoT devices is included in a vehicle, a phone, a medical device, or a meter. Example 5 may be the computing system of example 1, wherein the computing system is included in an edge device or communicatively coupled with the edge device. Example 6 may be the computing system of example 1, wherein the compaction module is to discard the values of the group. Example 7 may be the computing system of any of examples 1-6, wherein the compaction scheme includes function fitting, and the compaction module is to fit a function to the values of the group. Example 8 may be the computing system of any of examples 1-6, wherein the compaction scheme includes deviation from a representative value. Example 9 may be the computing system of example 8, wherein the compaction module is to generate the representative data as respective deviations of the values of the group from the representative value. Example 10 may be the computing system of example 8, wherein the compaction module is to generate the representative data as an indication of a number of values clustered around the representative value within a standard deviation. Example 11 may be the computing system of any of examples 1-6, wherein the compaction scheme is based on a bitmap index, and the compaction module is to populate at least one bitmap associated with the bitmap index based on the values of the group. Example 12 may be the computing system of any of examples 1-6, wherein the compaction module is to store at least a portion of the raw data. Example 13 may be the computing system of any of examples 1-6, further comprising: a query processing module, coupled with the network interface and the compaction module and to be loaded into the physical memory by execution by the one or more processors, to: process a query received by the network interface circuitry; identify responsive data based on the query, wherein the responsive data is to include at least one of raw data or uncompacted data; and cause the network interface circuitry to transmit the responsive data. Example 14 may be the computing system of example 13, further comprising: an uncompaction module, coupled with the compaction module and the query processing module and to be loaded in the physical memory for execution by the one or more processors, to generate the responsive data based on the representative data. Example 15 may be the computing system of example 14, wherein the uncompaction module is to generate the responsive data through a randomized algorithm for interpolation based on the representative data or application of a function indicated by the representative data.

In various embodiments, example 16 may be a computer-implemented method for compacting data, the method comprising: receiving, by a computing system, first data over a network from one or more Internet of Things (IoT) devices; identifying an attribute associated with the one or more of the IoT devices that is common to a first plurality of values included in the first data; determining a compaction scheme that is to indicate the first plurality of values; applying the compaction scheme to the first plurality of values to create compaction data; and storing the compaction data in at least one table of a database. Example 17 may be the computer-implemented method of example 16, where the applying of the compaction scheme comprises: generating a bitmap index based on the attribute and the first plurality of values. Example 18 may be the computer-implemented method of example 16, wherein the applying of the compaction scheme comprises: fitting a function to the first plurality of values. Example 19 may be the computer-implemented method of any of examples 16-18, further comprising: receiving, over the network, a request for data associated with the one or more IoT devices; determining response data based on the request and the compaction data; and transmitting, in response to the request, the response data over the network. Example 20 may be the computer-implemented method of example 19, wherein the determining the response data based on the request comprises: generating the response data based on the compaction data. Example 21 may be the computer-implemented method of any of examples 16-18, further comprising: determining another compaction scheme that is to indicate a second plurality of values included in the first data, wherein the second plurality of values have the attribute in common with the first plurality of values; and applying the other compaction scheme to the second plurality of values to create other compaction data.

In various embodiments, example 22 may be one or more non-transitory computer system-readable media comprising computing device-executable instructions, wherein the instructions, in response to execution by a computing system, cause the computing system to: process raw data received over a network from one or more Internet of Things (IoT) devices; group first data from the raw data based on a shared attribute associated with at least one of the IoT devices; select a compaction scheme based on the first data; generate second data based on application of the compaction scheme to the first data; and store the second data in a database to indicate the first data. Example 23 may be the one or more non-transitory computer system-readable media of example 22, wherein the instructions further cause the computing system to: process a request received from another computing system; generate third data associated with the one or more IoT devices based on the second data and the request; and transmit the third data to the other computing system in response to the request. Example 24 may include the one or more non-transitory computer system-readable media of any of examples 22-23, wherein the instructions to generate the second data comprise instructions to: populate at least one bitmap based on the first data, wherein at least one column of the bitmap is associated with the shared attribute. Example 25 may be the one or more non-transitory computer system-readable media of any of examples 22-23, wherein the instructions to generate the second data comprise instructions to: select a mean value based on the first data; and generate values of the second data based on values of the first data in relation to the mean value.

In various embodiments, example 26 may be an apparatus comprising: means for receiving, by a computing system, first data over a network from one or more Internet of Things (IoT) devices; means for identifying an attribute associated with the one or more of the IoT devices that is common to a first plurality of values included in the first data; means for determining a compaction scheme that is to indicate the first plurality of values; means for applying the compaction scheme to the first plurality of values to create compaction data; and means for storing the compaction data in at least one table of a database. Example 27 may be the apparatus of example 26, where the means for applying of the compaction scheme comprises: means for generating a bitmap index based on the attribute and the first plurality of values. Example 28 may be the apparatus of example 26, wherein the means for applying of the compaction scheme comprises: means for fitting a function to the first plurality of values. Example 29 may be the apparatus of any of examples 26-28, further comprising: means for receiving, over the network, a request for data associated with the one or more IoT devices; means for determining response data based on the request and the compaction data; and means for transmitting, in response to the request, the response data over the network. Example 30 may be the apparatus of example 29, wherein the means determining the response data based on the request comprises: means for generating the response data based on the compaction data. Example 31 may be the apparatus of any of examples 26-28, further comprising: means for determining another compaction scheme that is to indicate a second plurality of values included in the first data, wherein the second plurality of values have the attribute in common with the first plurality of values; and means for applying the other compaction scheme to the second plurality of values to create other compaction data.

Some portions of the preceding detailed description have been presented in terms of algorithms and symbolic representations of operations on data bits within a computer memory. These algorithmic descriptions and representations are the ways used by those skilled in the data processing arts to most effectively convey the substance of their work to others skilled in the arts. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Embodiments of the invention also relate to an apparatus for performing the operations herein. Such a computer program is stored in a non-transitory computer-readable medium. A machine-readable medium includes any mechanism for storing information in a form readable by a machine (e.g., a computer). For example, a machine-readable (e.g., computer-readable) medium includes a machine- (e.g., a computer-) readable storage medium (e.g., read-only memory ("ROM"), random access memory ("RAM"), magnetic disk storage media, optical storage media, flash memory devices).

The processes or methods depicted in the preceding figures can be performed by processing logic that comprises hardware (e.g., circuitry, dedicated logic, etc.), software (e.g., embodied on a non-transitory computer-readable medium), or a combination of both. Although the processes or methods are described above in terms of some sequential operations, it should be appreciated that some of the operations described can be performed in a different order. Moreover, some operations can be performed in parallel rather than sequentially.

Embodiments of the present invention are not described with reference to any particular programming language. It will be appreciated that a variety of programming languages can be used to implement the teachings of embodiments of the invention as described herein. In the foregoing Specification, embodiments of the invention have been described with reference to specific exemplary embodiments thereof. It will be evident that various modifications can be made thereto without departing from the broader spirit and scope of the invention as set forth in the following claims. The Specification and drawings are, accordingly, to be regarded in an illustrative sense rather than a restrictive sense.

What is claimed is:

1. An edge device, disposed at an edge of a network, for processing raw data from Internet of Things (IoT) devices, the device comprising:
   network interface circuitry to receive, at the edge of the network, the raw data from the IoT devices; and
   one or more processors and physical memory, co-located with the network interface circuitry, and coupled with network interface circuitry, to store a compaction module to be executed by the one or more processors, wherein:
   the compaction module, in response to execution, is to cause the edge device to:
      group, at the edge of the network, values included in the raw data based on at least one attribute of corresponding ones of the IoT devices from which the raw data is obtained; and
      generate, at the edge of the network, representative data based on application of at least one compaction scheme to the values of the group, wherein the application of the at least one compaction scheme is based on metadata that describes: how the at least one compaction scheme is to be applied to the values to generate the type of representative data.

2. The edge device of claim 1, further comprising:
   a database co-located with the network interface circuitry, the one or more processors and the physical memory, wherein the compaction module is to store the representative data in a table of the database.

3. The edge device of claim 1, wherein the compaction module is to discard the values of the raw data.

4. The edge device of claim 1, wherein at least one of the IoT devices is included in a vehicle.

5. The edge device of claim 1, wherein the compaction module is to further select the at least one compaction scheme based on the values of the group.

6. The edge device of claim 1, wherein the compaction module is to discard the values of the group.

7. The edge device of claim 1, wherein, when the metadata indicates the representative data to be generated is a function, the compaction scheme includes a function fitting compression scheme or a piecewise compaction scheme, and wherein the compaction module is to:
   fit a function to the values of the group,
   generate the function as a linear function or a quadratic function when the compaction scheme includes the function fitting compression scheme, and
   generate the function as a piecewise linear function when the compaction scheme includes the piecewise compaction scheme.

8. The edge device of claim 1, wherein, when the metadata indicates the representative data to be generated is a principal value, the compaction scheme includes deviation from the principal value.

9. The edge device of claim 8, wherein the compaction module is to generate the representative data as respective percentage deviations of the values of the group from the principal value or as respective standard deviations of the values of the group from the principal value.

10. The edge device of claim 8, wherein the compaction module is to generate the representative data as an indication of a number of values clustered around the representative value within a standard deviation.

11. The edge device of claim 1, wherein, when the metadata indicates the representative data to be generated is a bitmap index, the compaction module is to populate at least one bitmap associated with the bitmap index based on the values of the group.

12. The edge device of claim 1, wherein the compaction module is to store at least a portion of the raw data.

13. The edge device of claim 1, wherein the physical memory further stores a query processing module, to be executed by the one or more processors, to cause the edge device to:
process, at the edge of the network, a query received, from the network, by the network interface circuitry;
identify, at the edge of the network, responsive data based on the query, wherein the responsive data is to include at least one of raw data or uncompacted data; and
cause the network interface circuitry to transmit the responsive data further into the network.

14. The edge device of claim 13, wherein the physical memory further stores an uncompaction module, coupled with the compaction module and the query processing module, to be executed by the one or more processors, to generate the responsive data based on the representative data.

15. The edge device of claim 14, wherein the uncompaction module is to generate the responsive data through a randomized algorithm for interpolation based on the representative data or application of a function indicated by the representative data.

16. The edge device of claim 1, wherein the edge device is a selected one of a routers, a switch, an integrated access devices (IADs), or a multiplexer.

17. The edge device of claim 1, wherein, the representative data is a bitmap index, and the compaction scheme is a word-aligned hybrid bitmap compression scheme.

18. The edge device of claim 1, wherein the representative data includes an indication of a number of values comprising the raw data to be represented by the representative data.

19. The edge device of claim 1, wherein the compaction scheme is explicitly indicated or specified by a set of parameterized rules.

20. The edge device of claim 1, wherein the metadata further describes how the representative data is to be stored.

21. A computer-implemented method for compacting data, the method comprising:
receiving, by an edge device located at an edge of a network, first data from one or more Internet of Things (IoT) devices integrated with a vehicle;
identifying, by the edge device, at the edge of the network, an attribute associated with the one or more of the IoT devices integrated with the vehicle that is common to a first plurality of values included in the first data;
determining, by the edge device, at the edge of the network, a compaction scheme that is to indicate the first plurality of values;
applying, by the edge device, at the edge of the network, the compaction scheme to the first plurality of values to create compaction data for the first data; and
forwarding onto the network, by the edge device, from the edge of the network, the compaction data created for the first data.

22. The method of claim 21, wherein the application of the determined compaction scheme is based on metadata that describes:
a type of compaction data to be generated, wherein the type of compaction data to be generated comprises a function, a bitmap index, or a principal value,
how the selected at least one compaction scheme is to be applied to the values to generate the type of compaction data, and
how the compaction data is to be stored.

23. One or more non-transitory computer system-readable media comprising computing device-executable instructions, wherein the instructions, in response to execution by an edge device, located at an edge of a network, cause the edge device to:
process, at the edge of the network, raw data received from one or more Internet of Things (IoT) devices;
group, at the edge of the network, first data from the raw data based on a shared attribute associated with at least one of the IoT devices;
select, at the edge of the network, a compaction scheme based on the first data;
generate, at the edge of the network, second data based on application of the compaction scheme to the first data, wherein the application of the selected compaction scheme is based on metadata that describes: how the second data is to be stored; and
store the second data in a database to indicate the first data.

24. The one or more non-transitory computer system-readable media of claim 23, wherein the application of the selected compaction scheme is further based on the metadata further describing the type of second data to be generated, and how the selected compaction scheme is to be applied to the first data to generate the type of second data.

25. The one or more non-transitory computer system-readable media of claim 24, wherein the instructions further cause the edge device to:
process, at the edge of the network, a request received from the network;
generate, at the edge of the network, third data associated with the one or more IoT devices based on the second data and the request; and
transmit, at the edge of the network, the third data into the network to respond the request.

26. The one or more non-transitory computer system-readable media of claim 23, wherein one or more of the IoT devices are integrated with a vehicle.

* * * * *